(12) United States Patent
Odnoblyudov et al.

(10) Patent No.: US 11,901,487 B2
(45) Date of Patent: Feb. 13, 2024

(54) ULTRATHIN SOLID STATE DIES AND METHODS OF MANUFACTURING THE SAME

(71) Applicant: Micron Technology, Inc., Boise, ID (US)

(72) Inventors: Vladimir Odnoblyudov, Eagle, ID (US); Martin F. Schubert, Mountain View, CA (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 18/045,331

(22) Filed: Oct. 10, 2022

(65) Prior Publication Data

US 2023/0109959 A1 Apr. 13, 2023

Related U.S. Application Data

(60) Continuation of application No. 17/099,276, filed on Nov. 16, 2020, now Pat. No. 11,469,350, which is a
(Continued)

(51) Int. Cl.
| | |
|---|---|
| *H01L 21/00* | (2006.01) |
| *H01L 33/20* | (2010.01) |
| *H01L 33/08* | (2010.01) |
| *H01L 21/02* | (2006.01) |
| *H01L 33/38* | (2010.01) |
| *H01L 33/00* | (2010.01) |

(Continued)

(52) U.S. Cl.
CPC ........ *H01L 33/20* (2013.01); *H01L 21/02104* (2013.01); *H01L 33/0075* (2013.01); *H01L 33/0093* (2020.05); *H01L 33/08* (2013.01); *H01L 33/12* (2013.01); *H01L 33/38* (2013.01); *H01L 33/483* (2013.01); *H01L 33/62* (2013.01); *H01L 2933/0016* (2013.01)

(58) Field of Classification Search
CPC ............... H01L 33/20; H01L 21/02104; H01L 33/0075
See application file for complete search history.

(56) References Cited

U.S. PATENT DOCUMENTS

| | | | |
|---|---|---|---|
| 6,222,868 B1 | 4/2001 | Ouchi et al. | |
| 6,447,369 B1 * | 9/2002 | Moore | B24B 49/04 451/6 |

(Continued)

FOREIGN PATENT DOCUMENTS

| | | | | |
|---|---|---|---|---|
| EP | 2929572 A1 * | 10/2015 | ............. | H01L 21/78 |
| FR | 3062954 A1 * | 8/2018 | ......... | H01L 27/0207 |

(Continued)

*Primary Examiner* — Laura M Menz
(74) *Attorney, Agent, or Firm* — Perkins Coie LLP

(57) ABSTRACT

Various embodiments of SST dies and solid state lighting ("SSL") devices with SST dies, assemblies, and methods of manufacturing are described herein. In one embodiment, a SST die includes a substrate material, a first semiconductor material and a second semiconductor material on the substrate material, an active region between the first semiconductor material and the second semiconductor material, and a support structure defined by the substrate material. In some embodiments, the support structure has an opening that is vertically aligned with the active region.

20 Claims, 9 Drawing Sheets

Related U.S. Application Data continuation of application No. 16/804,504, filed on Feb. 28, 2020, now Pat. No. 10,840,410, which is a continuation of application No. 16/377,897, filed on Apr. 8, 2019, now Pat. No. 10,580,935, which is a continuation of application No. 16/022,409, filed on Jun. 28, 2018, now Pat. No. 10,256,367, which is a continuation of application No. 15/474,786, filed on Mar. 30, 2017, now Pat. No. 10,103,290, which is a division of application No. 13/918,745, filed on Jun. 14, 2013, now Pat. No. 9,653,647.

(51) Int. Cl.
*H01L 33/12* (2010.01)
*H01L 33/48* (2010.01)
*H01L 33/62* (2010.01)

(56) References Cited

U.S. PATENT DOCUMENTS

| | | | | |
|---|---|---|---|---|
| 8,951,842 | B2 * | 2/2015 | Fang | H01L 22/10 |
| | | | | 438/113 |
| 8,963,121 | B2 * | 2/2015 | Odnoblyudov | H01L 33/382 |
| | | | | 257/79 |
| 9,159,896 | B2 * | 10/2015 | Odnoblyudov | H01L 33/647 |
| 9,293,639 | B2 * | 3/2016 | Odnoblyudov | H01L 33/647 |
| 9,385,278 | B2 * | 7/2016 | Fang | H01L 22/34 |
| 9,530,930 | B2 * | 12/2016 | Liu | H01L 33/62 |
| 9,653,647 | B2 * | 5/2017 | Odnoblyudov | H01L 33/0075 |
| 9,728,696 | B2 * | 8/2017 | Odnoblyudov | H01L 33/647 |
| 9,847,372 | B2 * | 12/2017 | Rhodehouse | H01L 33/0062 |
| 10,103,290 | B2 * | 10/2018 | Odnoblyudov | H01L 33/12 |
| 10,134,969 | B2 * | 11/2018 | Odnoblyudov | H01L 33/0025 |
| 10,256,367 | B2 * | 4/2019 | Odnoblyudov | H01L 33/08 |
| 10,306,847 | B2 * | 6/2019 | Whitcher | A01G 9/246 |
| 10,475,976 | B2 * | 11/2019 | Odnoblyudov | H01L 27/04 |
| 10,580,935 | B2 * | 3/2020 | Odnoblyudov | H01L 21/02104 |
| 10,825,859 | B2 * | 11/2020 | Rhodehouse | H01L 27/156 |
| 10,840,410 | B2 * | 11/2020 | Odnoblyudov | H01L 33/0075 |
| 10,879,444 | B2 * | 12/2020 | Odnoblyudov | H01L 25/0753 |
| 11,469,350 | B2 * | 10/2022 | Odnoblyudov | H01L 33/62 |
| 11,563,158 | B2 * | 1/2023 | Odnoblyudov | H01L 33/62 |
| 2003/0189212 | A1 * | 10/2003 | Yoo | H01L 33/32 |
| | | | | 257/79 |
| 2009/0008654 | A1 * | 1/2009 | Nagai | H01L 25/0753 |
| | | | | 438/33 |
| 2011/0121332 | A1 | 5/2011 | Dupont et al. | |
| 2011/0241549 | A1 | 10/2011 | Wootton | |
| 2013/0181219 | A1 * | 7/2013 | Fang | H01L 22/34 |
| | | | | 438/33 |
| 2014/0110722 | A1 | 4/2014 | Kub et al. | |
| 2014/0159063 | A1 * | 6/2014 | Odnoblyudov | H01L 33/405 |
| | | | | 438/460 |
| 2014/0367686 | A1 * | 12/2014 | Odnoblyudov | H01L 33/0093 |
| | | | | 438/47 |
| 2015/0155440 | A1 * | 6/2015 | Fang | H01L 23/544 |
| | | | | 257/48 |
| 2015/0162513 | A1 * | 6/2015 | Odnoblyudov | H01L 33/64 |
| | | | | 438/33 |
| 2016/0020356 | A1 * | 1/2016 | Odnoblyudov | H01L 21/78 |
| | | | | 438/33 |
| 2016/0225967 | A1 * | 8/2016 | Odnoblyudov | H01L 33/32 |
| 2017/0207366 | A1 * | 7/2017 | Odnoblyudov | H01L 33/20 |
| 2017/0324014 | A1 * | 11/2017 | Odnoblyudov | H01L 27/156 |
| 2018/0309021 | A1 * | 10/2018 | Odnoblyudov | H01L 21/02104 |
| 2019/0058100 | A1 * | 2/2019 | Odnoblyudov | H01L 21/78 |
| 2019/0237621 | A1 * | 8/2019 | Odnoblyudov | H01L 33/38 |
| 2020/0066956 | A1 * | 2/2020 | Odnoblyudov | H01L 33/64 |
| 2020/0251615 | A1 * | 8/2020 | Odnoblyudov | H01L 33/62 |
| 2021/0091264 | A1 * | 3/2021 | Odnoblyudov | H01L 33/483 |
| 2021/0119095 | A1 * | 4/2021 | Odnoblyudov | H01L 25/0753 |
| 2023/0109959 | A1 * | 4/2023 | Odnoblyudov | H01L 33/483 |
| | | | | 257/91 |
| 2023/0163266 | A1 * | 5/2023 | Odnoblyudov | H01L 33/64 |
| | | | | 257/99 |

FOREIGN PATENT DOCUMENTS

| | | | | |
|---|---|---|---|---|
| FR | 3062954 A1 | 8/2018 | | |
| WO | WO-2011061664 A1 * | 5/2011 | | H01L 33/0079 |
| WO | WO-2014089175 A1 * | 6/2014 | | H01L 21/78 |
| WO | WO-2014120086 A1 * | 8/2014 | | H01L 33/0079 |

* cited by examiner

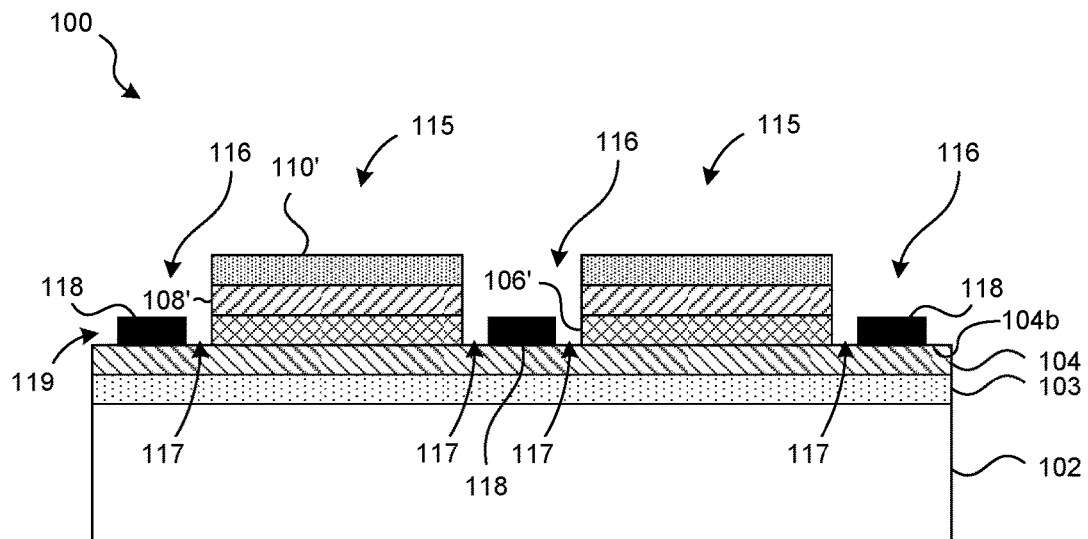
*FIG. 2G*
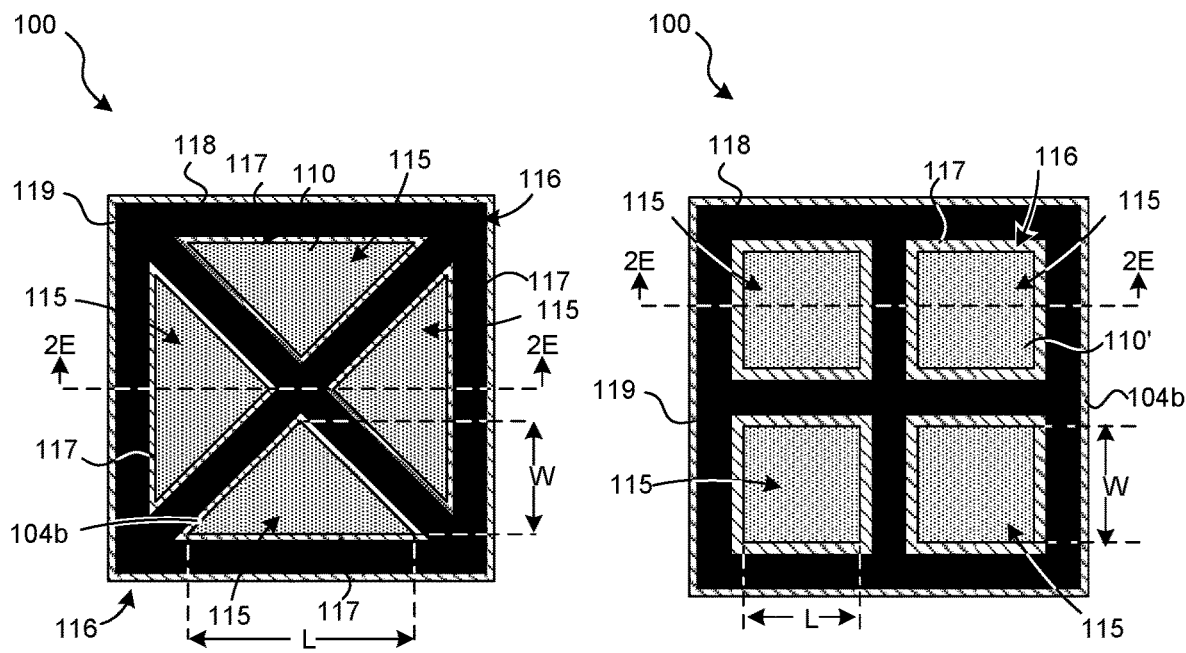
*FIG. 2H*  *FIG. 2I*

ULTRATHIN SOLID STATE DIES AND METHODS OF MANUFACTURING THE SAME

CROSS-REFERENCE TO RELATED APPLICATION(S)

This application is a continuation of U.S. patent application Ser. No. 17/099,276, filed Nov. 16, 2020; which is a continuation of U.S. patent application Ser. No. 16/804,504, filed Feb. 28, 2020, now U.S. Pat. No. 10,840,410; which is a continuation of U.S. patent application Ser. No. 16/377,897, filed Apr. 8, 2019, now U.S. Pat. No. 10,580,935; which is a continuation of U.S. patent application Ser. No. 16/022,409, filed Jun. 28, 2018, now U.S. Pat. No. 10,256,367; which is a continuation of U.S. patent application Ser. No. 15/474,786, filed Mar. 30, 2017, now U.S. Pat. No. 10,103,290; which is a divisional of U.S. patent application Ser. No. 13/918,745, filed Jun. 14, 2013, now U.S. Pat. No. 9,653,647; each of which is incorporated herein by reference in its entirety.

TECHNICAL FIELD

The present technology is directed generally to solid state transducer ("SST") dies, for example light emitting dies, having integrated support structures formed from engineered growth substrates, and methods of manufacturing such SST dies.

BACKGROUND

SST dies include light-emitting diodes ("LEDs"), organic light emitting diodes ("OLEDs"), polymer light-emitting diodes ("PLEDS"), and other types of light emitting dies. The energy efficiency and small size of SST dies has led to the proliferation of these devices in a multitude of products. For example, televisions, computer monitors, mobile phones, digital cameras, and other electronic devices utilize LEDs for image generation, object illumination (e.g., camera flashes) and/or backlighting. LEDs are also used for signage, indoor and outdoor lighting, traffic lights, and other types of illumination. Improved fabrication techniques for these semiconductor devices have both lowered device cost and increased device efficiency.

FIGS. 1A-1C illustrate a process for forming an SST die where the growth substrate is completely removed and a separate support substrate is attached to support the semiconductor materials. FIG. 1A illustrates an SST die 10 formed by growing epitaxial layers, including an N-type gallium nitride ("GaN") material 12, an active region 14, and a P-type GaN material 16, on a growth substrate 20 to form an SST structure 22. The active region 14 can be a light-emitting indium gallium nitride ("InGaN") material sandwiched between the N-type and P-type semiconductor materials 12 and 16. The growth substrate 20 is typically either sapphire, silicon carbide ("SiC"), silicon, or SiC-on-insulator ("SiCOI"). The growth substrate 20 can alternatively be an engineered substrate, such as silicon on polyaluminum nitride.

It is sometimes desirable to remove the growth substrate 20 to improve the optical properties of the SST die 10 or to gain electrical access to the SST structure 22. For example, growth substrates, in particular engineered substrates, are typically opaque and thus will block emission of light produced by the SST structure 22 if the growth substrate 20 is not removed. However, since the epitaxial layers 12, 14, and 16 are extremely delicate and thin (e.g., less than 10 microns), the outer epitaxial layer 16 of the SST die 10 must first be attached to a support substrate 24 before removing the growth substrate 20. As shown in FIG. 1B, the SST structure 22 is sandwiched between the growth substrate 20 and the support substrate 24. FIG. 1C shows the SST die 10 after the growth substrate 20 has been removed in its entirety by known processes. In production, a wafer having a large number of SST dies 10 is processed to form the SST structure 22, and the support substrate 24 has the same form factor as the wafer. After the growth substrate 20 is removed, the assembly is then diced to singulate the individual SST dies 10 for mounting in a package.

One drawback of the method shown in FIGS. 1A-1C is that the growth substrate 20 is completely sacrificed, which adds both time and material costs. Another drawback is that the support substrate itself is often fairly thick and adds to the thickness of the resulting device. Furthermore, the process of bonding the support substrate 24 to the SST structure 22 is costly and may damage the support structure 24. As such, the method described with respect to FIGS. 1A-1C is capital intensive and expensive to perform.

Many SSL designs address this issue by using optically transmissive substrates, such as sapphire. As a result, sapphire substrates are not removed from the front side of the die. However, sapphire is expensive and thin (e.g., 0.15 to 5 microns) and requires a thicker conductive plate on the back side of the device. A thicker conductive plate can induce stress in the die and increases cost of production. Accordingly, several improvements in support structures of SST dies may be desirable.

DETAILED DESCRIPTION

Various embodiments of SST dies with light emitting structures or other SSL structures and associated methods of manufacturing SST dies are described below. As used herein, the term "SST structure" refers to the semiconductor materials that transduce either electricity into radiation or radiation into electrical current, and the term "SST die" generally refers to a die with one or more SST structures and associated components, such as growth and/or support substrates, buffer materials, reflective layers, contacts, etc. The individual SST dies can be packaged to form SST devices. The term "growth substrate" is used throughout to include substrates upon which and/or in which the semiconductor materials that form the SST structure are formed. A person skilled in the relevant art will also understand that the technology may have additional embodiments, and that the technology may be practiced without several of the details of the embodiments described below with reference to FIGS. 2A-2U.

Figure 1A:
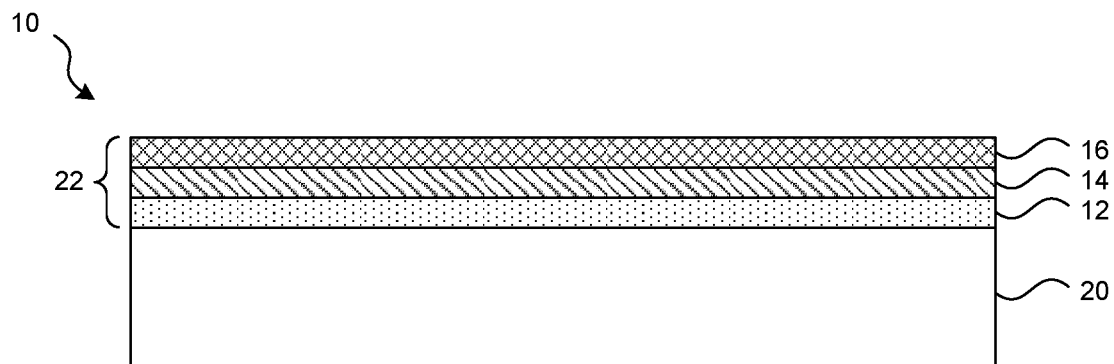
FIGS. 1A-1C are schematic cross-sectional views of various stages in a method for forming an LED device according to the prior art.
Figure 1B:
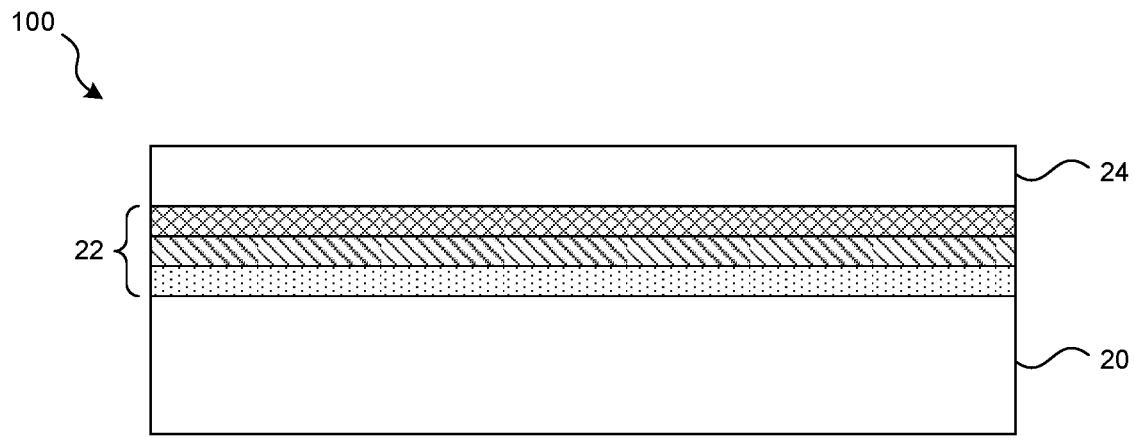
Figure 1C:
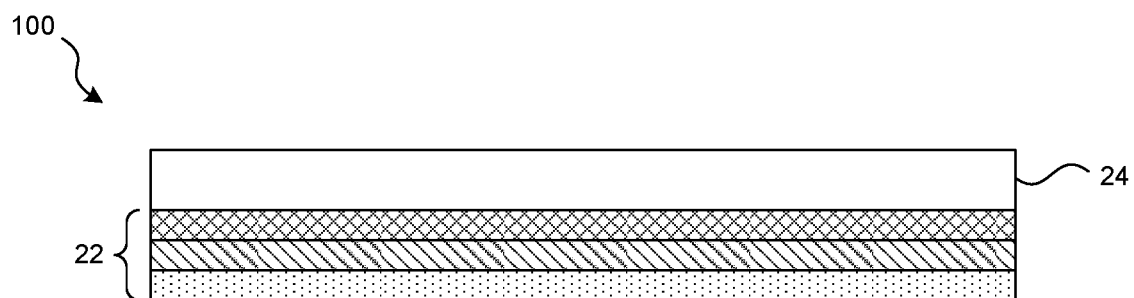
Figure 2A:
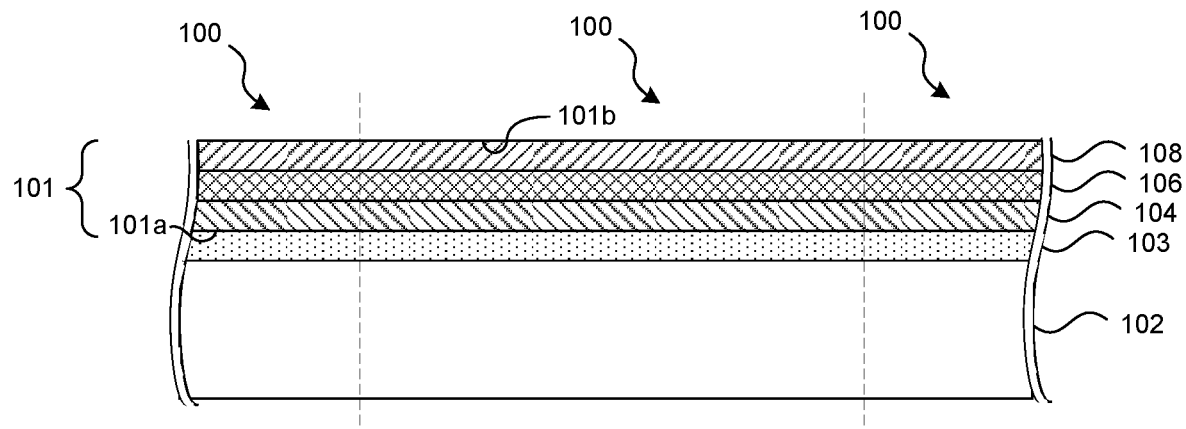
FIGS. 2A-2U are schematic cross-sectional and top views of a portion of a microelectronic substrate undergoing a process for forming SST dies in accordance with embodiments of the technology.
Figure 2B:
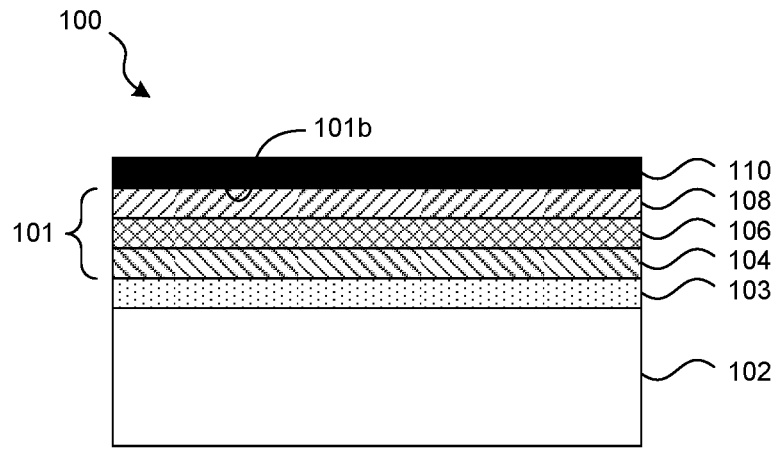
Figure 2C:
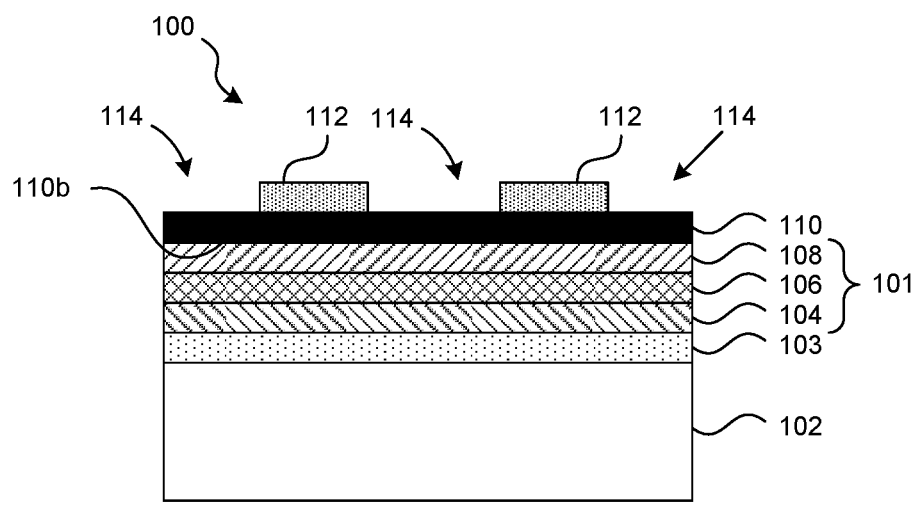
Figure 2D:
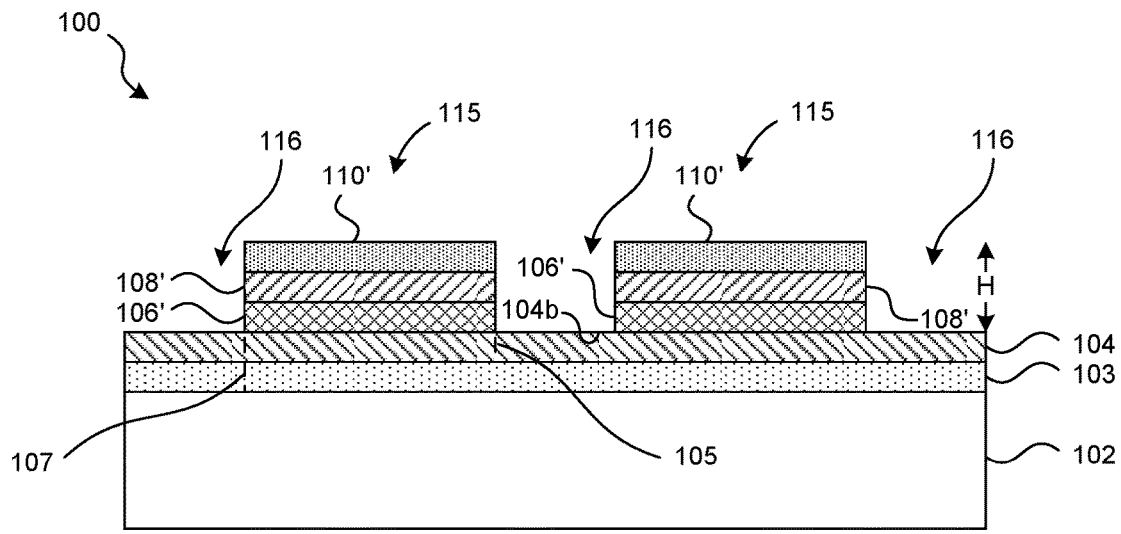
Figures 2E, 2F:
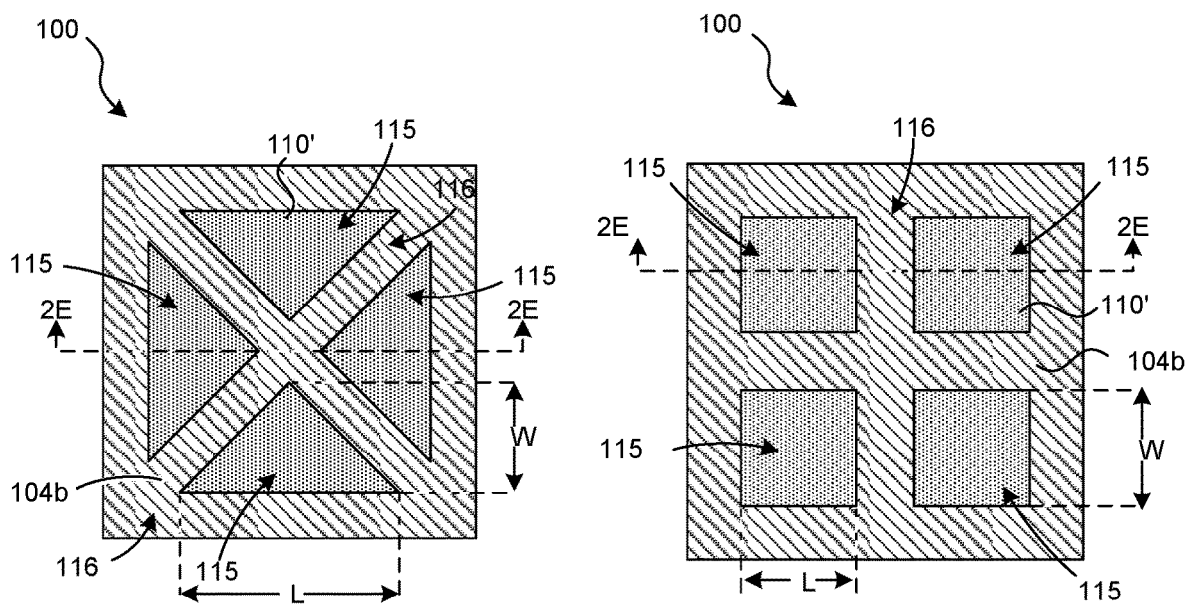
Figure 2J:
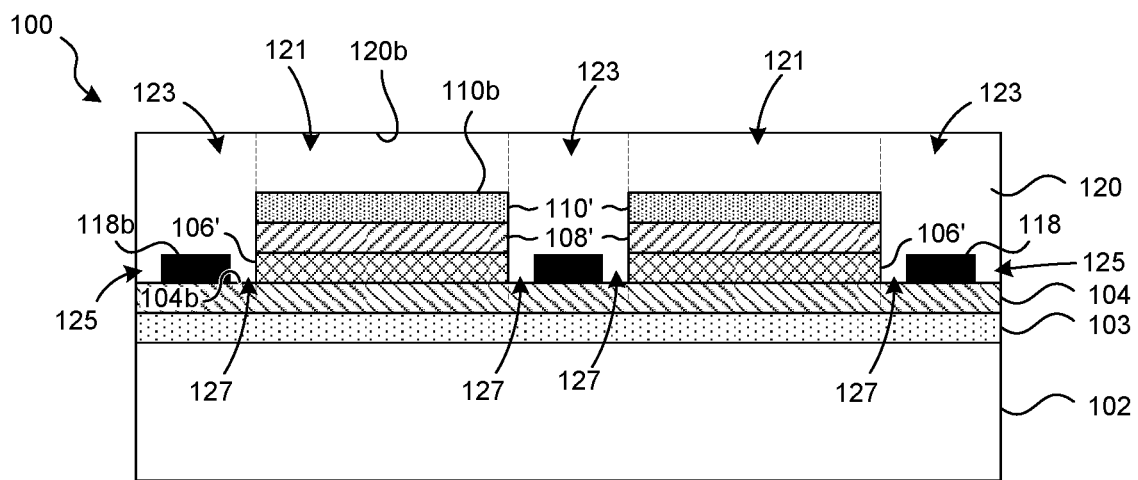
Figure 2K:
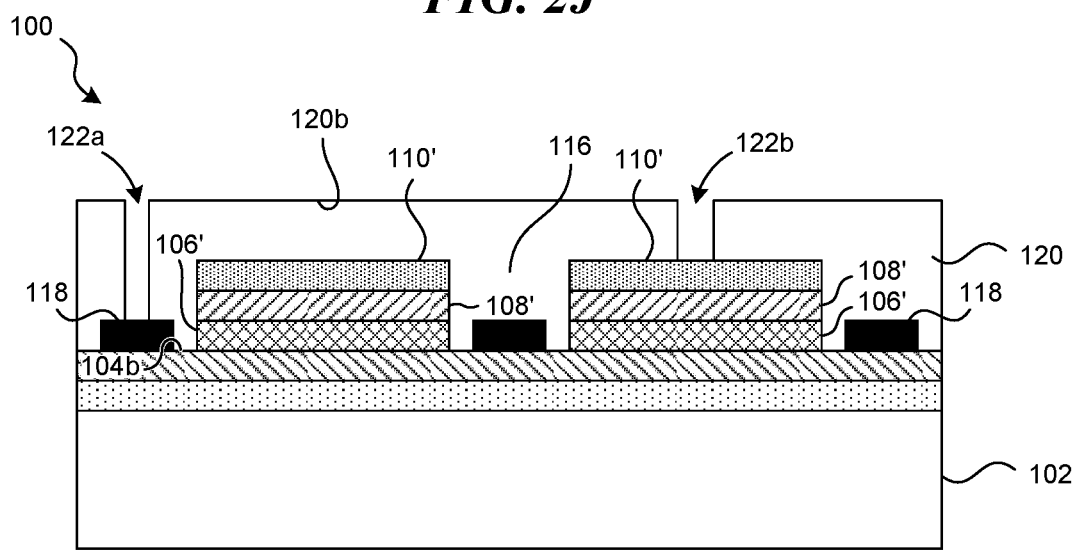
Figure 2L:
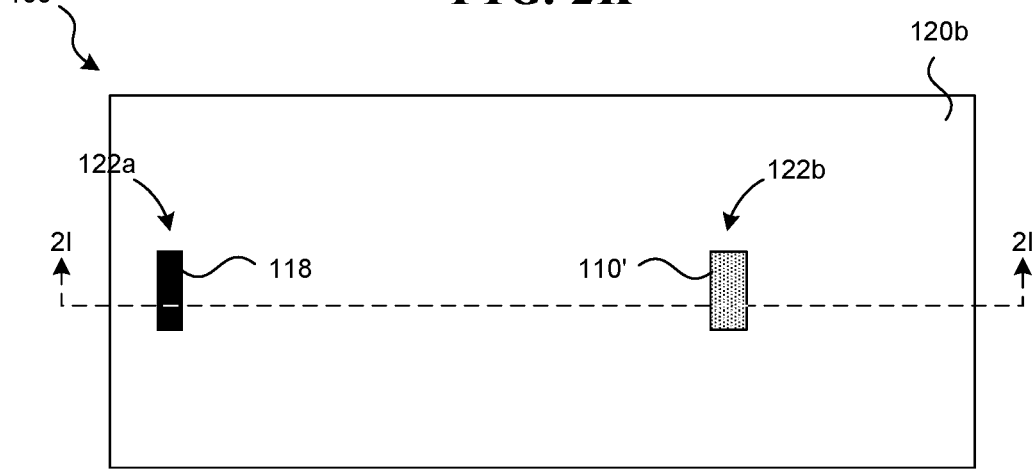
Figure 2M:
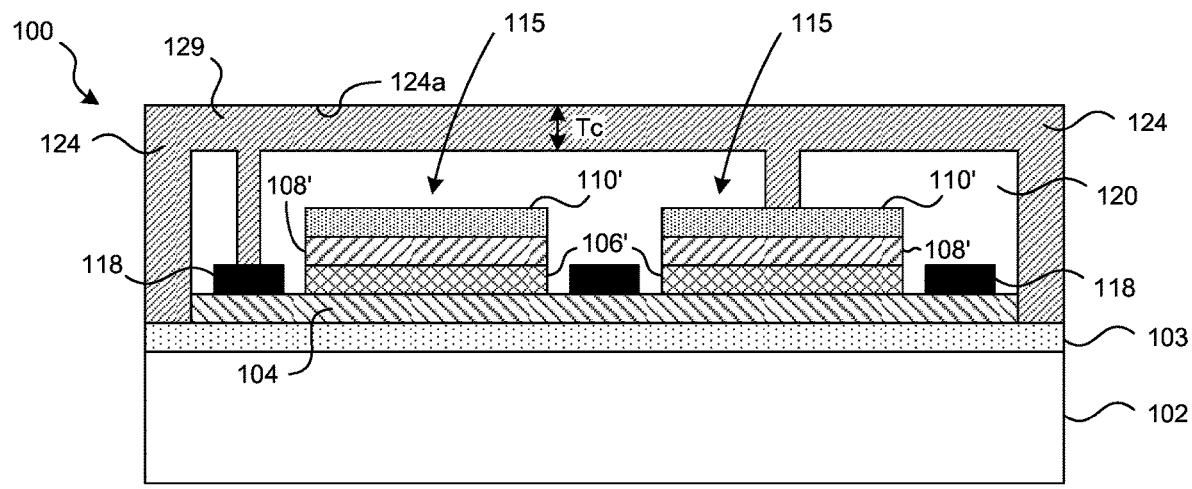
Figure 2N:
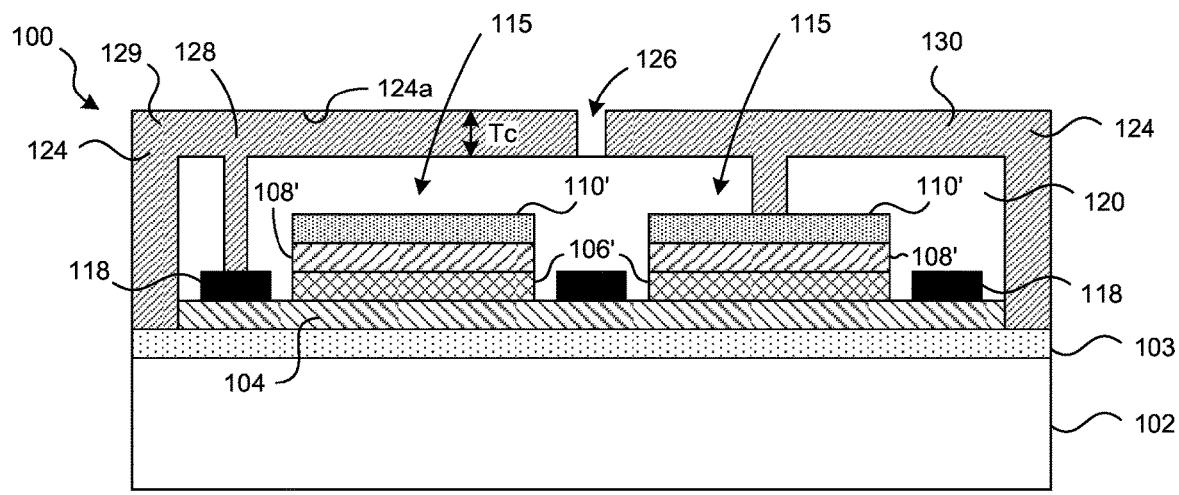
Figure 2O:
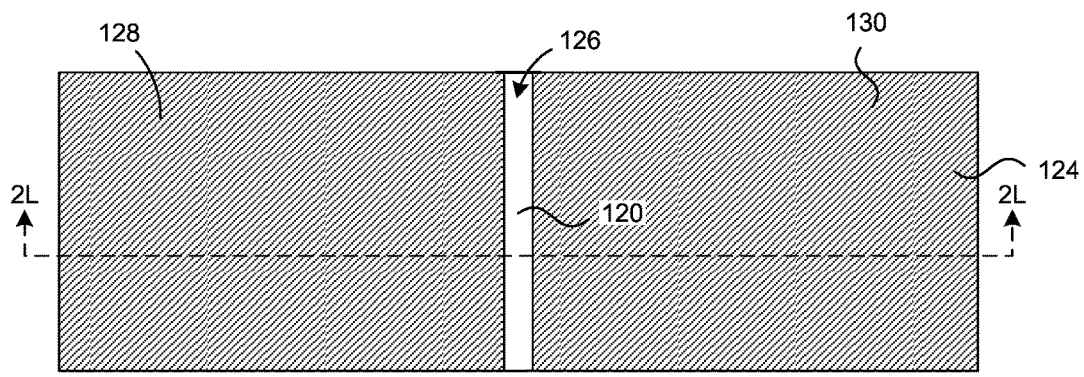
Figure 2P:
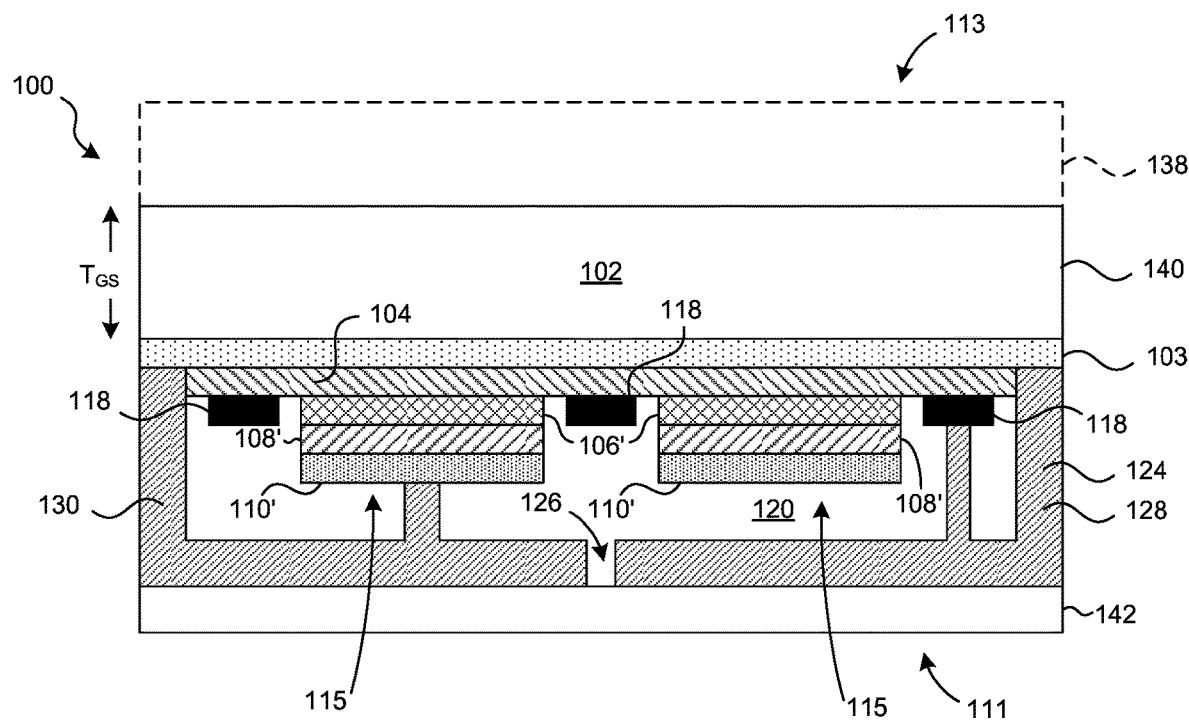
Figure 2Q:
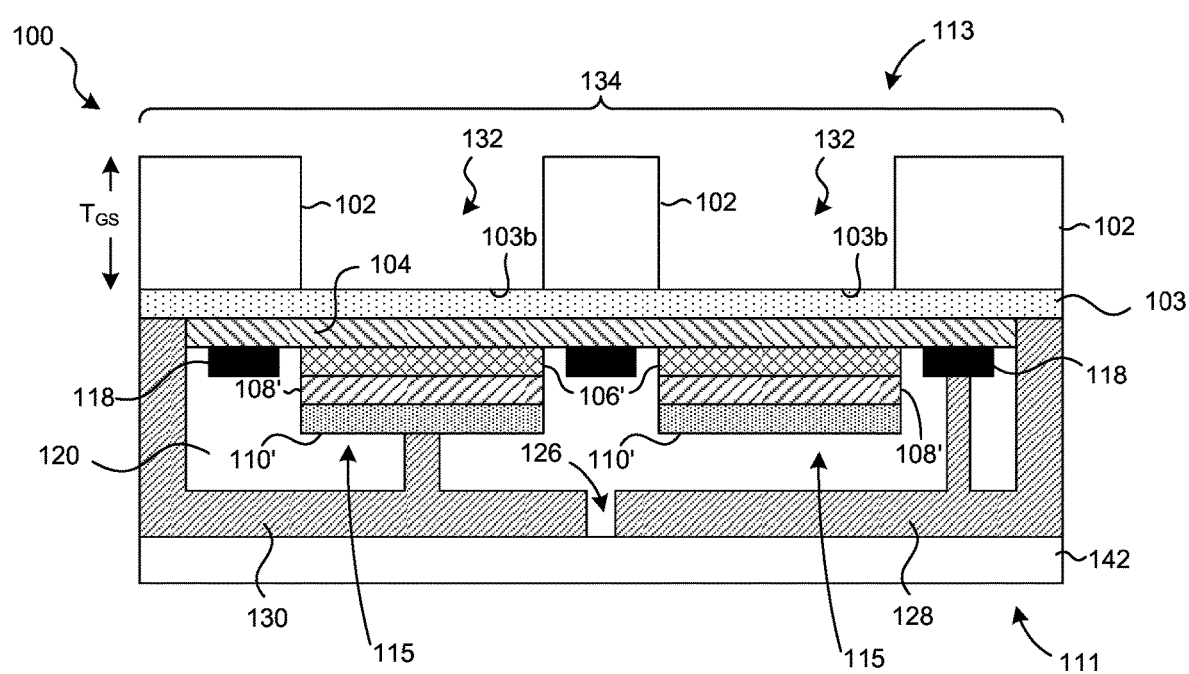
Figure 2R:
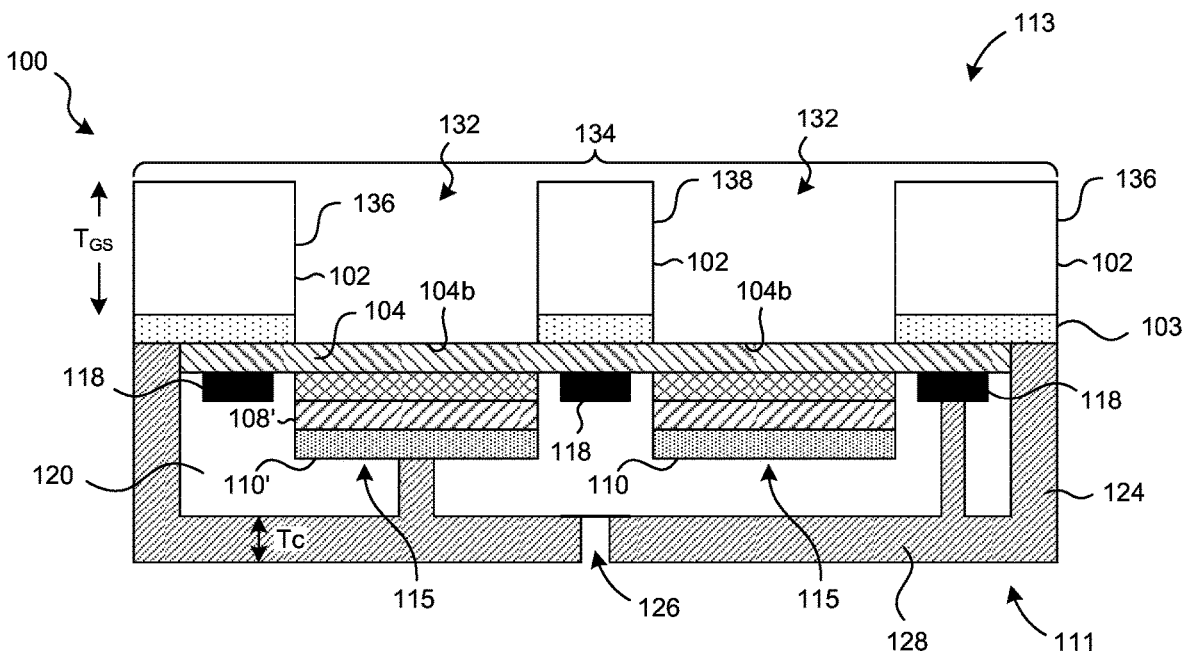
Figure 2S:
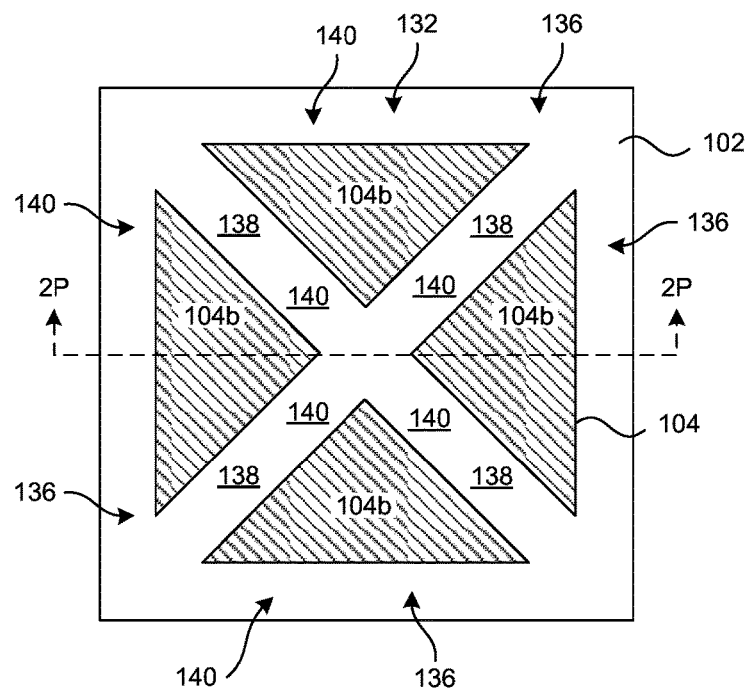
Figure 2T:
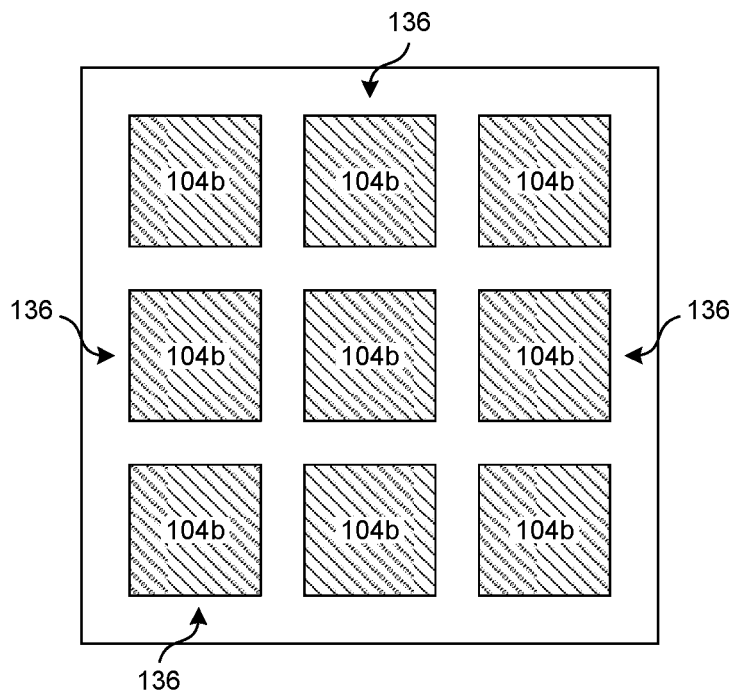
Figure 2U:
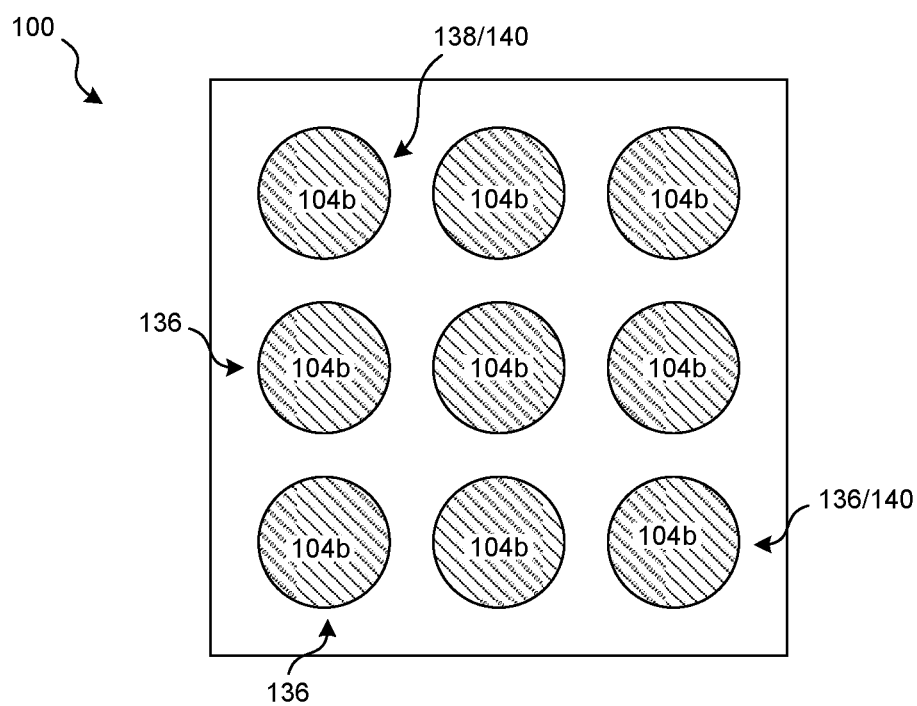

FIGS. 2A-2U are schematic cross-sectional and top views of a portion of a microelectronic substrate undergoing processing in accordance with embodiments of the technology. In the following description, common acts and structures are identified by the same reference numbers. Even though only particular processing operations and associated structures are illustrated in FIGS. 2A-2U, in certain embodiments the process can also include forming a lens, a mirror material, support structures, conductive interconnects, and/or other suitable mechanical/electrical components (not shown).

FIG. 2A illustrates a portion of a semiconductor wafer having a plurality of SST dies 100. The SST dies 100 can include an SST structure 101 formed on a growth substrate 102. The growth substrate 102 can include a silicon (Si) material (e.g., with a Si(1,1,1) crystal orientation), and in several embodiments the growth substrate can be an engineered substrate. Engineered substrates can include a structural material and a growth surface suitable for epitaxy. For example, the structural material can be selected to have the desired strength for processing and a coefficient of thermal expansion that approximates the epitaxial materials formed on the growth surface, and the growth surface can be a different material bonded to the structural material that provides the desired crystalline structure to form the semiconductor epitaxial layers. In one embodiment, the structural material is poly-aluminum nitride and the growth material is silicon (1,1,1). As is known in the art, poly-aluminum nitride is opaque and does not transmit emissions produced by the SST structure 101.

As shown in FIG. 2A, an optional buffer material 103 can be formed on the growth substrate 102, and the SST structure 101 can then be formed on the buffer material 103. In certain embodiments, the optional buffer material 103 can include aluminum nitride (AlN), GaN, zinc nitride (ZnN), and/or other suitable materials. In other embodiments, the optional buffer material 103 may be omitted, and the SSL structure 101 may be formed directly on the growth substrate 102. In further embodiments, other suitable materials (e.g., zinc oxide ($ZnO_2$)) may be formed on the growth substrate 102 in addition to or in lieu of the buffer material 103.

The SSL structure 101 can include a first semiconductor material 104, an active region 106, and a second semiconductor material 108 stacked one on the other. In one embodiment, the first and second semiconductor materials 104 and 108 include an N-type GaN material and a P-type GaN material, respectively. In another embodiment, the first and second semiconductor materials 104 and 108 include a P-type GaN material and an N-type GaN material, respectively. In further embodiments, the first and second semiconductor materials 104 and 108 can individually include at least one of gallium arsenide (GaAs), aluminum gallium arsenide (AlGaAs), gallium arsenide phosphide (GaAsP), gallium(III) phosphide (GaP), zinc selenide (ZnSe), boron nitride (BN), AlGaN, and/or other suitable semiconductor materials. For reference purposes, one side of the first semiconductor material 104 defines a first or front side 101a of the SST structure 101 and an opposing side of the second semiconductor material 108 defines a second or back side 101b of the SST structure 101.

The active region 106 can include a single quantum well ("SQW"), MQWs, and/or a bulk semiconductor material. As used hereinafter, a "bulk semiconductor material" generally refers to a single grain semiconductor material (e.g., InGaN) with a thickness greater than about 10 nanometers and up to about 500 nanometers. In certain embodiments, the active region 106 can include an InGaN SQW, InGaN/GaN MQWs, and/or an InGaN bulk material. In other embodiments, the active region 106 can include aluminum gallium indium phosphide (AlGaInP), aluminum gallium indium nitride (AlGaInN), and/or other suitable materials or configurations.

In certain embodiments, at least one of the first semiconductor material 104, the active region 106, and the second semiconductor material 108 can be formed on the growth substrate 102 via metal organic chemical vapor deposition ("MOCVD"), molecular beam epitaxy ("MBE"), liquid phase epitaxy ("LPE"), and hydride vapor phase epitaxy ("HVPE"). In other embodiments, at least one of the foregoing components and/or other suitable components (not shown) of the SSL structure 101 may be formed via other suitable epitaxial growth techniques.

FIG. 2B is a cross-sectional view of one of the SST dies 100 after a contact 110 has been formed at the second side 101b of the SST structure 101. FIG. 2C is a cross-sectional view of the SST die 100 during a subsequent operation of the process after a masking material 112 (e.g., a photoresist) has been formed on a back surface 110b of the contact 110. The masking material 112 can then be patterned to define a plurality of mask openings 114 via photolithography and/or other suitable techniques. The mask openings 114 individually expose selected portions of the contact 110.

FIG. 2D is a cross-sectional view and FIG. 2E is a top view of the SST die 100 after portions of the SSL structure 101 have been removed to form a plurality of emitters 115 separated from one another by corresponding SSL openings 116. In certain embodiments, the masking material 112 (FIG. 2C) is also removed from the contact 110. Suitable techniques for removing materials from the SSL structure 101 and/or the contact 110 can include wet etching, dry etching, laser ablation, and/or other suitable techniques. In the illustrated embodiment, the SSL structure 101 is etched until reaching a back surface 104b first semiconductor material 104. In other embodiments, as shown by dashed lines 105 in FIG. 2D, etching the SSL structure 101 may be etched down into the optional buffer material 103, and/or as shown by dashed lines 107 the materials may be etched down to the growth substrate 102.

The emitters 115 can individually include an active element 106' defined by the remaining portions of the active region 106 at the emitters 115 and a second semiconductor element 108' defined by the remaining portions of the second semiconductor material 108 at the emitters 115. The emitters 115 can also have the first semiconductor material 104 in common.

The emitters 115 may be arranged in the array shown in FIG. 2E or in any array (e.g., a two-by-two array shown in FIG. 2F for illustration purposes), radially in a circular pattern, in a semicircular pattern, and/or other suitable patterns (not shown). In further embodiments, the emitters 115 may be arranged in a combination of different arrays and/or patterns. In yet further embodiments, the emitters 115 may be arranged randomly on the SST die 100.

In certain embodiments, the emitters 115 can have a generally similar shape, size, composition of material, and/or other suitable characteristics. For example, in the illustrated embodiment shown in FIG. 2E, the emitters 115 have a generally triangular cross section. In some embodiments, the emitters can have a generally polygonal cross section (FIG. 2F), and in some embodiments the emitters 115 can have a circular cross-section (see FIG. 2U). The emitters 115 can also have a generally similar height H (e.g., from about 50 nanometers to about 500 nanometers). In other embodiments, at least one of a length L, width W, and height H of at least one of the emitters 115 may have other suitable values different than other emitters 115.

FIG. 2G is a cross-sectional view and FIG. 2H are top views of the SST die 100 after another contact 118 has been formed on the back surface 104b of the first semiconductor material 104. For clarity, the contact 118 defines a first contact and the contact 110 defines a second contact in this embodiment. The SST die 100 can have a plurality of gaps 117 between each of the plurality of emitters 115 and the first contact 118 that prevent the active element 106' and second semiconductor element 108' from contacting the first contact 118. A portion of the back surface 104b of the first semiconductor material 104 can be exposed at a bottom portion of the gaps 117 at this point of the process. The SST die 100 can further include a peripheral gap 119 between an outward-facing sidewall of the first contact 118 and the outside edge of the first semiconductor material 104. Another portion of the first semiconductor surface 104b can be exposed along a bottom portion of the peripheral gap 119.

In certain embodiments, the first and/or second contacts 118, 110 can include indium tin oxide ("ITO"), aluminum zinc oxide ("AZO"), fluorine-doped tin oxide ("FTO"), and/or other suitable transparent conductive oxides ("TCOs"). In other embodiments, the first and/or second contacts 118, 110 can include copper (Cu), aluminum (Al), silver (Ag), gold (Au), platinum (Pt), and/or other suitable metals. In further embodiments, the first and/or second contact 118, 110 can include a combination of TCOs and one or more metals. Techniques for forming the first and/or second contacts 118, 110 can include MOCVD, MBE, spray pyrolysis, pulsed laser deposition, sputtering, electroplating, and/or other suitable deposition techniques.

FIG. 2J is a cross-sectional view of the SST die 100 after an insulating material 120 has been formed on the SST die 100. In certain embodiments, the insulating material 120 at least substantially fills the SSL openings 116 (FIG. 2D), gaps 117 and peripheral gaps 119. The insulating material 120 can include silicon dioxide ($SiO_2$), silicon nitride (SiN), hafnium silicate ($HfSiO_4$), zirconium silicate ($ZrSiO_4$), hafnium dioxide ($HfO_2$), zirconium dioxide ($ZrO_2$), aluminum oxide ($Al_2O_3$), and/or other suitable transparent materials with a dielectric constant higher than about 1.0 at 20° C. under 1 kHz. Techniques for forming the insulating material 120 can include chemical vapor deposition ("CVD"), atomic layer deposition ("ALD"), spin-on coating, thermal oxidation, and/or other suitable techniques.

In certain embodiments, as shown in FIG. 2J, the insulating material 120 can have first portions 121 (shown in dashed lines for illustrative purposes) superimposed with the back surface 110b of the second contact 110' and second portions 123 superimposed with a back surface 118b of the first contact 118 and exposed portions of the back surface 104b of the first semiconductor material 104 adjacent the first contact 118. The second portions 123 of the insulating material 120 between emitters 115 can have a plurality of fingers 127 that extend into the gaps 117 (FIG. 2G) between the emitters 115 and the first contact 118. At least a portion of the insulating material 120 is in direct contact with portions of the first semiconductor material 104. In some embodiments, the second portions 123 of the insulating material 120 at the periphery can further include a peripheral finger 125 that extends into the peripheral gap 119 and directly contacts the sidewall of the first semiconductor material 104. The insulating material 120 electrically isolates the individual emitters from one another and also provides support and protection to the emitters 115 during packaging.

FIG. 2K is a cross-sectional view and FIG. 2L is a top view of the SST die 100 illustrating a subsequent stage after a plurality of channels 122a, 122b have been formed in the insulating material 120 to expose a portion of the first contact 118 and the second contact 110, respectively. Techniques for removing a portion of the insulating material 120 can include photo-patterning and etching, laser ablation, and/or other suitable techniques.

FIG. 2M is a cross-sectional view of the SST die 100 after a conductive material 124 has been formed on the insulating material 120. The conductive material 124 can have a back portion 129 superimposed with the remaining insulating material 120, and the back portion 129 can have a thickness Tc from about 10 to about 50 microns. In certain embodiments, the conductive material 124 can include indium tin oxide ("ITO"), aluminum zinc oxide ("AZO"), fluorine-doped tin oxide ("FTO"), and/or other suitable transparent conductive oxide ("TCOs"). In other embodiments, the conductive material 124 can include copper (Cu), aluminum (Al), silver (Ag), gold (Au), platinum (Pt), and/or other suitable metals. In further embodiments, the conductive material 124 can include a combination of TCOs and one or more metals. Techniques for forming the conductive material 124 can include MOCVD, MBE, spray pyrolysis, pulsed laser deposition, sputtering, electroplating, and/or other suitable deposition techniques.

In certain embodiments (not shown), a barrier material (e.g., WTi, Ta, TaN) and an optional seed material (e.g., Cu, Ni) can be formed sequentially over the back side of the SST die 100. The barrier and seed materials can be formed using CVD, PVD, ALD, patterning, and/or other suitable methods. In some embodiments, the conductive material 124 can be made from metal (e.g., Cu) and plated onto the seed material.

FIG. 2N is a cross-sectional view and FIG. 2O is a top view of the SST die 100 during another operation of the process where a channel 126 is etched through the conductive material 124 to divide the conductive material 124 into a first terminal 128 corresponding to the first contact 118 and a second terminal 130 corresponding to the second contact 110. At this stage of the process, the emitters 115 are between growth substrate 102 and the first and second terminals 128 and 130. In many applications, the support substrate is a non-transmissive (e.g., opaque) material, such as engineered substrates made from silicon on poly-aluminum nitride. Thus, since the terminals 128 and 130 remain as permanent components, it is necessary to extract the output of the SST structure 101 from the other side of the SST die 100.

FIGS. 2P-2U show aspects of processing the SST die 100 to extract light from a front side 113 of the growth substrate 102. FIG. 2P shows the SST die 100 after it has been attached to a temporary carrier substrate 142. The temporary carrier substrate 142 can be any suitable material used in the handling and processing of semiconductor wafers, such as a carrier tape or a stainless steel plate. In one embodiment, a back side 111 of the SST die 100 is mounted to the carrier substrate 142 and the growth substrate 102 on a front side 113 is thinned (e.g., using grinding) to a thickness TGs of about 20 microns to about 50 microns.

FIG. 2Q is a cross-sectional view illustrating the SST die 100 after portions of the of the growth substrate 102 aligned with the emitters 115 have been removed using grinding, etching, and/or other processes to expose the buffer material 103. FIG. 2R is a cross-sectional view and FIG. 2S is a top view of the SST die 100 portions of the buffer material 103 aligned with the emitters 115 have been removed to expose portions of the first semiconductor material 104 through recesses 132. In certain embodiments, the exposed surface of the first semiconductor material 104 can be textured to improve light extraction.

As shown in FIGS. 2R and 2S, the remaining portions of the growth substrate 102 between the recesses 132 form a support structure 134 for the SST die 100. The use of an opaque growth substrate to also form the permanent support structure for the SST structure eliminates the need to attach a separate support substrate to the back side 111 of the SST die 100. This reduces the material costs for an additional support structure and eliminates the step of bonding such a permanent support substrate to the SST die 100. The support structure 134 is generally configured to provide rigidity for the SST die 100 while allowing sufficient light extraction by superimposing the support structure 134 with the first contact 118, and exposing the emitters 115 through the recesses 132. Accordingly, light is not generated under the opaque support structure 134.

In certain embodiments, the partial support structure 134 can have a peripheral portion 136 extending around the periphery of the die 100 and an interior portion 138 contiguous with the peripheral portion 136, as shown in FIGS. 2R and 2S. The peripheral portion 136 and/or the interior portion 138 can be comprised of one or more shorter segments 140. The interior portion 138 can extend interiorly from the peripheral portion 136, cross through the interior of the die 100, and reconnect with the peripheral portion 136. As shown in FIG. 2S, in some embodiments two or more interior portions 138 can intersect. One or more segments 140 of the peripheral portion 136 and/or one or more segments of the interior portion 138 can intersect to form a closed space therebetween that defines the one or more recesses 132 on the die 100.

The peripheral portion 136, interior portion 138 and/or segments 140 can have generally similar shapes, sizes, composition of material, and/or other suitable characteristics. For example, in the illustrated embodiment, each segment 140 has a generally linear shape such that the recesses 132 formed therebetween have a polygonal cross-sectional shape (e.g., triangle (FIG. 2S), square (FIG. 2T), pentagon, hexagon, etc.). In other embodiments, each segment 140 can have a non-linear shape such that the recesses 132 have a circular cross-sectional shape, as shown in FIG. 2U. In other embodiments, at least one of the length L, the width W, and the height H of at least one of the peripheral portion 136, interior portion 138 and/or segments 140 may have other suitable values different than at least one other peripheral portion 136, interior portion 138 and/or segment 140.

In certain embodiments, the conductive material 124 plated on the opposite side of the die 100 from the partial support structure 134 can also provide support and rigidity to the die 100. In contrast to conventional devices, the conductive material 124 can have a reduced thickness that results in improved stress management for the SST die 100 as well as lower cost over existing devices. Furthermore, the resulting SST die 100 has improved thermal properties over conventional dies because the recesses 132 on the first side 101a of the SST structure 101 and the thermally conductive materials on the second side 101b can efficiently dissipate heat produced by the SST structure 101. As discussed, conventional dies include an insulative support substrate that does not allow such dissipation of heat.

From the foregoing, it will be appreciated that specific embodiments of the technology have been described herein for purposes of illustration, but that various modifications may be made without deviating from the disclosure. Many of the elements of one embodiment may be combined with other embodiments in addition to or in lieu of the elements of the other embodiments. Accordingly, the disclosure is not limited except as by the appended claims.

We claim:

1. A solid state transducer (SST) die, comprising:
a growth substrate;
a continuous layer of a first semiconductor material coupled to the growth substrate;
a plurality of SST structures on the growth substrate, each SST structure including:
a portion of the continuous layer of the first semiconductor material,
a second semiconductor material, and
a light emitting material between the portion of the continuous layer of the first semiconductor material and the second semiconductor material;
a first contact in contact with the continuous layer of the first semiconductor material; and
a second contact in contact with the second semiconductor material of each of the plurality of SST structures,
wherein the growth substrate includes a plurality of openings, each opening aligned with the light emitting material of a corresponding one of the plurality of SST structures.

2. The SST die of claim 1, wherein the growth substrate includes a support layer and a buffer layer.

3. The SST die of claim 2, wherein the first semiconductor material is in direct contact with the buffer layer.

4. The SST die of claim 2, wherein the first contact is aligned with a region of the support layer in which no opening is formed.

5. The SST die of claim 2, wherein the support layer is opaque to light emitted by the light emitting material.

6. The SST die of claim 2, wherein the support layer comprises poly-aluminum nitride.

7. The SST die of claim 2, wherein the buffer layer comprises aluminum nitride (AlN), GaN, zinc nitride (ZnN), zinc oxide (ZnO$_2$), or a combination thereof.

8. The SST die of claim 1, further comprising a gap between the first contact and the second semiconductor material of each of the plurality of SST structures.

9. The SST die of claim 8, further comprising an insulating material on the SST structure, the first contact and the second contact.

10. The SST die of claim 9, wherein the insulating material extends into the gap.

11. The SST die of claim 9, wherein the insulating material comprises silicon dioxide (SiO$_2$), silicon nitride (SiN), hafnium silicate (HfSiO$_4$), zirconium silicate (ZrSiO$_4$), hafnium dioxide (HfO$_2$), zirconium dioxide (ZrO$_2$), aluminum oxide (Al$_2$O$_3$), or a combination thereof.

12. The SST die of claim 9, wherein the insulating material has a dielectric constant higher than about 1.0 at 20° C. under 1 kHz.

13. The SST die of claim 9, further comprising a conductive material on the insulating material and in contact with the first contact and the second contact.

14. The SST die of claim 13, wherein the conductive material comprises indium tin oxide ("ITO"), aluminum zinc oxide ("AZO"), fluorine-doped tin oxide ("FTO"), copper (Cu), aluminum (Al), silver (Ag), gold (Au), platinum (Pt), or a combination thereof.

15. The SST die of claim 13, wherein the conductive material is separated by one or more channels into a first terminal in electrical contact with the first contact and a second terminal in electrical contact with the second contact.

16. The SST die of claim 1, wherein the growth substrate has a thickness of about 20 to about 50 microns.

17. A solid state transducer (SST) die, comprising:
a growth substrate comprising a plurality of openings;
a continuous layer of a first semiconductor material coupled to the growth substrate and extending over the plurality of openings;
a plurality of SST structures on the growth substrate, each SST structure aligned with a corresponding one of the plurality of openings and including:
  a portion of the continuous layer of the first semiconductor material,
  a second semiconductor material, and
  a light emitting material between the portion of the continuous layer of the first semiconductor material and the second semiconductor material;
a first contact in contact with the continuous layer of the first semiconductor material; and
a second contact in contact with the second semiconductor material of each of the plurality of SST structures.

18. The SST die of claim 17, wherein the first contact and the second contact are on an opposite side of the continuous layer of the first semiconductor material from the growth substrate.

19. The SST die of claim 17, wherein each of the plurality of openings has a generally polygonal cross-section.

20. The SST die of claim 17, wherein each of the plurality of openings has a generally circular cross-section.

* * * * *